(12) United States Patent
Yoshizaki et al.

(10) Patent No.: US 7,531,037 B2
(45) Date of Patent: May 12, 2009

(54) DEVICE AND METHOD FOR FORMING MACROMOLECULE CRYSTAL

(75) Inventors: Izumi Yoshizaki, Tsukuba (JP); Satoshi Sano, Tsukuba (JP); Tomoyuki Kobayashi, Tsukuba (JP); Masaru Sato, Tsukuba (JP); Moritoshi Motohara, Tsukuba (JP); Hiroaki Tanaka, Shinjuku-ku (JP); Sachiko Takahashi, Shinjuku-ku (JP); Shinichi Shinozaki, Shinjuku-ku (JP); Mari Yamanaka, Shinjuku-ku (JP); Koji Inaka, Yamatokoriyama (JP)

(73) Assignee: Japan Aerospace Exploration Agency, Tokyo (JP)

( * ) Notice: Subject to any disclaimer, the term of this patent is extended or adjusted under 35 U.S.C. 154(b) by 414 days.

(21) Appl. No.: 11/287,219

(22) Filed: Nov. 28, 2005

(65) Prior Publication Data

US 2006/0081173 A1   Apr. 20, 2006

Related U.S. Application Data

(63) Continuation of application No. PCT/JP2004/007682, filed on May 27, 2004.

(30) Foreign Application Priority Data

May 27, 2003   (JP) .............................. 2003-149585

(51) Int. Cl.
C30B 29/58   (2006.01)
(52) U.S. Cl. ............................ 117/68; 117/69; 117/923
(58) Field of Classification Search .............. 117/68.69, 117/932, 933
See application file for complete search history.

(56) References Cited

U.S. PATENT DOCUMENTS

| 6,258,331 B1 * | 7/2001 | Sanjoh .................... 422/245.1 |
| 6,319,315 B1 * | 11/2001 | Sanjoh ....................... 117/206 |
| 2004/0231580 A1 * | 11/2004 | Moriyama et al. ............. 117/2 |
| 2005/0170489 A1 * | 8/2005 | Anderson et al. ........... 435/226 |

FOREIGN PATENT DOCUMENTS

| JP | 01 139102 A | 5/1989 |
| JP | 2003 34600 A | 2/2003 |

(Continued)

OTHER PUBLICATIONS

Garcia-Ruiz et al; "Granada Crystallisation Box: a new device for protein crystallisation by counter-diffusion techniques"; Acta Crystallographica.; 2002; pp. 1638-1642; D 58; Denmark.

(Continued)

*Primary Examiner*—Robert M Kunemund
(74) *Attorney, Agent, or Firm*—Jacobson Holman PLLC

(57) ABSTRACT

Disclosed is a macromolecule-crystal forming apparatus and method capable of obtaining a macromolecule crystal in a simplified and efficient manner. The device comprises a first container containing a sample of macromolecule, a second container containing a gel acting as a buffer material during the crystallization of the macromolecule, and a third container containing a precipitant solution having a function of facilitating the aggregation of molecules during the crystallization of the macromolecule. These containers are connected together in a given manner so as to allow the macromolecule sample and the precipitant to be brought into contact with one another through the gel to induce the crystallization of the macromolecule.

13 Claims, 14 Drawing Sheets

FOREIGN PATENT DOCUMENTS

| | | |
|---|---|---|
| JP | 2004 26528 A | 1/2004 |
| WO | WO 02 12597 A1 | 2/2002 |

OTHER PUBLICATIONS

Garcia-Ruiz et al; "Investigations on Protein Crystal Growth by the Gel Acupuncture Method"; ActaCrystallographica Section D; 1994; pp. 484-490; D 50; GB.

Tanaka et al; "A Simplified Counter Diffusion Method Combined with a 1 D Simulation Program for Optimizing Crystallization Conditions"; Journal of Synchrotron Radiation; 2004; pp. 11, 45-48; vol. 1; GB.

* cited by examiner (a)

(b)

(a)

(b)

DEVICE AND METHOD FOR FORMING MACROMOLECULE CRYSTAL

This is a continuation of PCT/JP04/007682 filed May 27, 2004 and published in Japanese.

TECHNICAL FIELD

The present invention relates to a device for crystallization of macromolecules, and more particularly, to the crystallization of macromolecules by a liquid-liquid diffusion process.

BACKGROUND ART

In this day and age called the post-genomic era, instead of traditional researches based on heuristic approach, a new approach is required which is capable of developing biological macromolecules with various structures on the basis of comprehensive genome data, analyzing their molecular structures and functions, artificially designing a molecular structure based on the analytical result to prepare more highly functional pharmaceutical molecules and proteins, and applying them to drug discoveries, biological sciences, medical sciences or industries. The acquisition of a higher-quality macromolecule crystal is essential for performing the molecular structure analysis with a higher degree of accuracy, and thus an experimental test on crystallization of macromolecules is a very sort of basic and vital step. What is firstly required under these circumstances is to establish a technique for screening the conditions of a crystallization test in a simplified and speedy manner and preparing a high-quality crystal according to the obtained optimal crystallization conditions, and the establishment of such a technique is also a R & D that is societal demand. A primary technique for crystallization of macromolecules includes a vapor diffusion process, a batch process, a dialysis process and a liquid-liquid diffusion process.

Heretofore, the vapor diffusion process has been most widely used, because of relatively simple procedures of this process itself, and the existence of a large amount of information about crystallization accumulated in past years by many researchers and a number of commercially available products and screening kits using the vapor diffusion process.

However, optimal crystallization conditions for the vapor diffusion process can be found only if a crystallization test is repeatedly performed using a large number of combinations of various macromolecule samples and various precipitating-agent or precipitant solutions different in concentration. The reason comes from the fact that, in the search of crystallization conditions for the vapor diffusion process, the conditions of one sample drop can be searched only in the linear interval between a certain initial condition and a terminal condition determined by the concentration of a precipitant solution in a reservoir. In contrast, the crystallization process using liquid-liquid diffusion in a narrow tube or tubule allows almost all concentration conditions to be created at either point in a single tubule with time. Thus, it can be said that the liquid-liquid diffusion process in a tubule is simple and efficient as a technique for finding optimal crystallization conditions.

In the conventional liquid-liquid diffusion process, the crystallization of a macromolecule in a tubule has been performed by forming layers of a macromolecule sample and a precipitant solution in the tubule without mixing them up. In this technique, the macromolecule sample and the precipitant solution are diffused into one another through the interface therebetween. The precipitant solution generally has a diffusion rate greater than that of the macromolecule sample, and thereby the crystallization will be initiated in a region of the macromolecule sample.

Late years, in this technique, there has been developed a process of inducing the diffusion between the above two solutions through a gel layer having a function of buffering the crystal growth rate of a macromolecule. The use of this process can eliminate the need for taking account of preventing intermixing between the two solutions during formation of a double layer thereof. This process also has a feature in that the intervention of the gel allows the respective diffusion rates of the two solutions to be reduced so as to provide an extended diffusion time. It is desirable to induce the diffusion in sufficient time, because a macromolecule crystal prepared at a lower growth rate generally has a higher quality.

In the above conventional technique for forming a macromolecule crystal by means of liquid-liquid diffusion to be induced under the intervention of gel, a gel layer is formed in a vessel, and a tubule containing a sample of macromolecule is put in the vessel in such a manner as to insert the front end of the tubule into the gel layer by a given length. After the insertion, a precipitant solution is poured on the gel layer to form a double layer structure of the gel layer and the precipitant solution layer.

As time passes in this state, the precipitant solution in the precipitant layer is diffused into the gel layer, and then diffused from the front end of the tubule into the macromolecule sample solution in the tubule. In this way, an intended environment is created where the precipitant solution is brought into contact with the macromolecule sample within the tubule to form a macromolecule crystal. Then, as time further passes, the precipitant solution is continuously diffused to have a concentration gradient in which the concentration of the precipitant solution is gradually reduced in a direction from the front end toward the inside of the tubule. Concurrently, the macromolecule sample in the tubule is reversely diffused into the gel to have a concentration gradient in which the concentration of the macromolecule sample in the tubule is gradually reduced in a direction from the inside toward the front end of the tubule.

The presence of the above mutual concentration gradients allows an optimal point for crystal growth of the macromolecule to be provided with high probability so as to obtain an excellent crystal.

However, it has been pointed out that the above conventional crystal formation technique involves a problem about the risk of outflow of the macromolecule sample in the tubule, technical difficulties in inserting the tubule into the gel layer uniformly by a given length, and variation in sample setting operation in a case where it is required to prepare numbers and various types of samples, resulting in poor quality of an obtained crystal or poor process yield.

Further, the conventional technique cannot sufficiently meet the need for preparing a great number of macromolecule sample crystals in current researches.

Moreover, the device for the conventional technique involves a structural problem about ineffective consumption of precipitant and gel in large quantity.

DISCLOSURE OF INVENTION

In view of the above circumstances, it is therefore an object of the present invention to provide a macromolecule-crystal forming device and method capable of obtaining a macromolecule crystal in a simplified and efficient manner.

It is another object of the present invention to provide a macromolecule-crystal forming device and method capable of obtaining an excellent or high-quality macromolecule crystal.

In order to achieve the above objects, according to a first aspect of the present invention, there is provided a device for forming a macromolecule crystal, which comprises a first container having at least one opening and containing a sample of macromolecule, a second container having at least two openings and containing a gel for buffering the crystallization of the macromolecule, and a third container having at least one opening and containing a precipitant solution to be brought into contact with the macromolecule sample so as to facilitate the crystallization of the macromolecule, wherein the first to third containers are arranged to allow the macromolecule sample in the first container and the precipitant solution in the third container to be diffused through the gel in the second container, while allowing the precipitant solution to be brought into contact with the macromolecule sample within the first container.

Preferably, the opening of the first container is connected to a first one of the openings of the second container, and a second one of the openings of the second container is connected to the opening of the third container.

Preferably, the second container is made of an elastic material, wherein an end of the first container having the opening thereof is inserted into one of the ends of the second container each having a corresponding one of the openings thereof, and an end of the third container having the opening thereof is inserted into the other end of the second container, whereby the connection between the respective ends is maintained by means of the elastic force of the second container.

Further, it is preferable that the first and third containers are connected to the second container in a displaceable manner relative to one another.

According to a second aspect of the present invention, there is provided a device for forming a macromolecule crystal, which comprises a first container having at least one opening and containing a sample of macromolecule, a second container having at least two openings and containing a gel for buffering the crystallization of the macromolecule, and a third container incorporating the first and second containers arranged in such a manner that the opening of the first container and a first one of the openings of the second container are connected together to allow the macromolecule sample and the gel to be in contact with one another, and containing a precipitant solution to be brought into contact with the macromolecule sample so as to facilitate the crystallization of the macromolecule, wherein the gel and the precipitant solution are in contact with one another at a second one of the openings of the second container, so that the precipitant solution is diffused into the macromolecule sample in the first container through the gel.

In this device, it is preferable that the second container is made of an elastic material, and an end of the first container having the opening thereof is inserted into an end of the second container having the first opening thereof, whereby the connection between the ends is maintained by means of the elastic force of the second container.

Further, it is desirable that each of at least the macromolecule sample and the precipitant solution is hermetically sealed.

According to a third aspect of the present invention, there is provided a device for forming a macromolecule crystal, which comprises a first tubular container having an open end and containing a sample of macromolecule, a second tubular container having first and second opposite open ends and containing a gel for buffering the crystallization of the macromolecule, and a third tubular container incorporating the first and second tubular containers arranged in such a manner that the open end of the first tubular container and the first open end of the second tubular container are connected together to allow the macromolecule sample and the gel to be in contact with one another, and containing a precipitant solution to be brought into contact with the macromolecule sample so as to facilitate the crystallization of the macromolecule, wherein the precipitant solution is contained in the third tubular container to allow the gel and the precipitant solution to be in contact with one another at the second open end of the second tubular container.

In a preferred embodiment, the first tubular container is inserted into and connected to the second tubular container, to establish the contact between the macromolecule sample in the first tubular container and the gel in the second tubular container.

Further, the second tubular container may be designed to hold the open end of the first tubular container received therein and maintain the connection therewith by means of an elastic force.

In another preferred embodiment, the third tubular container is formed in a test-tube-like shape having a lower portion in which the precipitant solution is contained, wherein a lower one of the open ends of the second tubular container is immersed in the precipitant solution to establish the contact between the precipitant solution and the gel in the second tubular container so as to allow the precipitant solution to be diffused into the gel and then into the macromolecule sample.

In still another preferred embodiment, the macromolecule sample in the first tubular container is diffused into the gel in the second tubular container through the connected portion between the first and second tubular containers, and the precipitant solution is diffused into the gel in the second tubular container and the macromolecule sample in the first tubular container through an opening of the second open end of the second tubular container.

Each of the first and third tubular containers may have a hermetically sealed end on the other side of their end connected to the second tubular container. This makes it possible to prevent vaporization of the macromolecule sample and the precipitant solution so as to maintain adequate controllability.

In yet another preferred embodiment, the device is designed to induce in the first tubular container a concentration gradient such that the concentration of the macromolecule sample is increased in a direction getting away from the interface between the gel in the second tubular container and the macromolecule sample, and the concentration of the precipitant solution is reduced in the direction.

According to a fourth aspect of the present invention, there is provided a method for forming a macromolecule crystal, which comprises the steps of providing a first container having at least one opening and containing a sample of macromolecule, providing a second container having at least two openings and containing a gel for buffering the crystallization of the macromolecule, connecting the first and second containers through the opening of the first container and a first one of the openings of the second container to allow the macromolecule sample and the gel to be brought into contact with one another, providing a third container containing a precipitant solution to be brought into contact with the macromolecule sample so as to facilitate the crystallization of the macromolecule, and allowing the gel in the second container to be brought into contact with the precipitant solution through a second one of the openings of the second container while maintaining the contact between the macromolecule sample in the first container and the gel in the second container.

In one preferred embodiment, the method further includes the steps of providing an elongated tube material which has opposite open ends, supplying the macromolecule sample from one of the open ends of the tube material to the inside of the tube material, and cutting the tube material to a given length to form the first container.

In this case, it is preferable to connect one of the open ends of the tube material to a storage tank containing the macromolecule sample, and connect a vacuum pump to the other open end to form a negative pressure in the inside of the tube material, or utilize a capillary phenomenon, so as to allow the macromolecule sample to be supplied to the inside of the tube material.

Alternatively, a pump filled with the macromolecule sample and connected to one of the open ends of the tube material may be activated to supply the macromolecule sample to the inside of the tube material.

In another preferred embodiment, the method further includes the steps of providing an elongated tube material which has opposite open ends, supplying the gel from one of the open ends of the tube material to the inside of the tube material, and cutting the tube material to a given length to form the second container.

In this case, it is preferable to connect one of the open ends of the tube material to a storage tank containing the gel, and connect a vacuum pump to the other open end to form a negative pressure in the inside of the tube material, so that the gel is supplied to the inside of the tube material according to the negative pressure.

Alternatively, a pump filled with the gel and connected to one of the open ends of the tube material may be activated to supply the gel to the inside of the tube material.

In these embodiments, the tube material may have elasticity.

As a substitute for the gel, any suitable buffer material, such as a porous material, having substantially the same function as that of the gel, may be used.

According to a fifth aspect of the present invention, there is provided a device for forming a macromolecule crystal, which comprises a first container having at least one opening and containing a sample of macromolecule, a second container having at least two openings and containing a gel for buffering a crystallization solution condition, a crystallization initiation period and a crystal-growth rate of the macromolecule, and a plurality of connected third containers each having at least one opening and containing a precipitant solution to be brought into contact with the macromolecule sample so as to facilitate the crystallization of the macromolecule, wherein the first to third containers are arranged to allow the macromolecule sample in the first container and the precipitant solution in a selected one of the third containers to be diffused through the gel in the second container, while allowing the precipitant solution to be brought into contact with the macromolecule sample within the first container.

In one preferred embodiment, each of the third containers has an opening for communication or connection with the second container, and an additional opening provided with a detachable sealing cap.

According to a sixth aspect of the present invention, there is provided a method for forming a macromolecule crystal, which comprises the steps of providing a first container having at least one opening and containing a sample of macromolecule, providing a second container having at least two openings and containing a gel for buffering the crystallization of the macromolecule, connecting the first and second containers through the opening of the first container and a first one of the openings of the second container to allow the macromolecule sample and the gel to be brought into contact with one another, providing a plurality of integrally connected third containers each containing a precipitant solution to be brought into contact with the macromolecule sample so as to facilitate the crystallization of the macromolecule, and allowing the gel in the second container to be brought into contact with the precipitant solution through a second one of the openings of the second container while maintaining the contact between the macromolecule sample in the first container and the gel in the second container.

In this case, it is preferable to form each of the third containers to have an opening for communication or connection with the second container and an additional opening provided with a detachable sealing cap, and perform the adjustment and replacement of the precipitant solution through the additional opening.

According to a seventh aspect of the present invention, there is provided a method for forming a macromolecule crystal, which comprises the steps of providing a first container having at least one opening and containing a sample of macromolecule, providing a second container having at least two openings and containing a gel for buffering the crystallization of the macromolecule, connecting the first and second containers through the opening of the first container and a first one of the openings of the second container to allow the macromolecule sample and the gel to be brought into contact with one another, providing a plurality of integrally connected third containers each containing a precipitant solution to be brought into contact with the macromolecule sample so as to facilitate the crystallization of the macromolecule, allowing the gel in the second container to be brought into contact with the precipitant solution through a second one of the openings of the second container while maintaining the contact between the macromolecule sample in the first container and the gel in the second container, and, after a lapse of a given time from the initiation of the contact between the gel and the precipitant solution, replacing a part or all of the precipitant solution.

In this case, each of the third containers may have one end located on the opposite side of the other end in contact with the gel and formed with a through-hole, to allow the replacement of the precipitant solution to be performed through the through-hole. During the process of the crystallization, this through-hole is appropriately sealed. When a portion of the third container having the through-hole is made of a polymeric material, the sealing is typically performed by a thermal fusion bonding process. Alternatively, the through-hole may be sealed using a plug or cap.

A better understanding of the present invention can be obtained when the following detailed description of the preferred embodiment is considered in conjunction with the accompanying drawings.

BRIEF DESCRIPTION OF DRAWINGS

FIG. 16 (b) is a sectional view of the syringe case unit 20.

FIG. 17 (b) is a top plan view of the cap 25.

BEST MODE FOR CARRYING OUT THE INVENTION

With reference to the drawings, an embodiment of the present invention will now be described.

Figure 1:
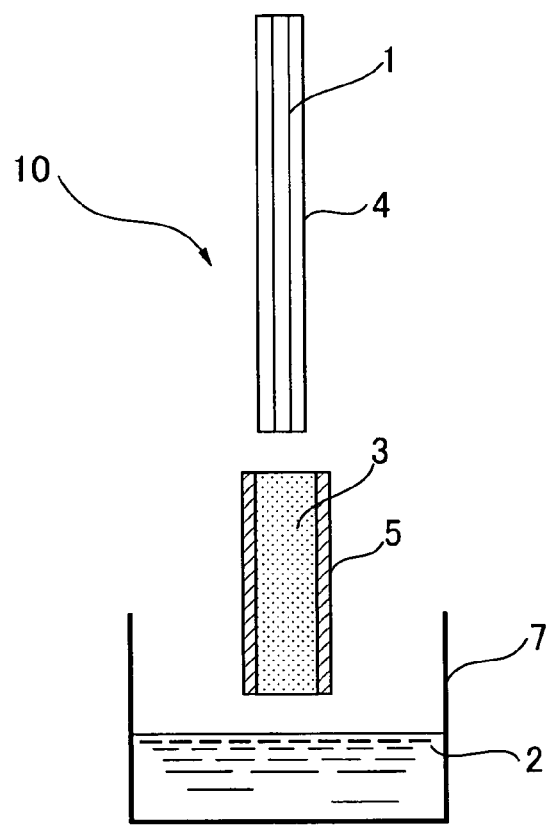
FIG. 1 is a conceptual diagram of a macromolecule-crystal forming device 10 of the present invention.

Referring to FIG. 1, a macromolecule-crystal forming device 10 according to one embodiment of the present invention is conceptually illustrated that is intended to form a crystal of a protein using a solution containing the protein, which serves as a macromolecule sample.

The macromolecule-crystal forming device 10 according to this embodiment comprises a tubule-shaped first container or capillary 4 which contains the macromolecule sample (protein solution) 1, and a tubule-shaped first container or silicon tube 5 which contains a gel 3. The silicon tube 5 has opposite open ends, and a cylindrical inner space filled with the gel in advance. The gel 3 serves as a buffer material acting as a buffer to a crystallization solution condition, a crystallization initiation period and a crystal-growth rate in the process of a crystallization phenomenon of the macromolecule. The macromolecule-crystal forming device 10 further includes a third container 7 containing a precipitant solution 2 having a function of aggregating protein molecules during the crystallization of the protein 1 to facilitate the crystallization.

One of the features of the present invention is to provide a first container containing a sample solution of macromolecule, a second container containing a gel acting as a buffer material during the crystallization of the biomaterial, and a third container containing a precipitant solution having a function of facilitating the aggregation of molecules during the crystallization of the macromolecule, and connecting these containers in a given manner so as to allow the macromolecule sample and the precipitant to be brought into contact with one another through the gel to induce the crystallization of the macromolecule. In this case, a gel and a precipitant solution may be mixed together in the inner space of the second container to form a gelatinized precipitant solution, and the obtained gelled precipitant solution may be brought into contact with the macromolecule sample in the first container.

Figure 2:
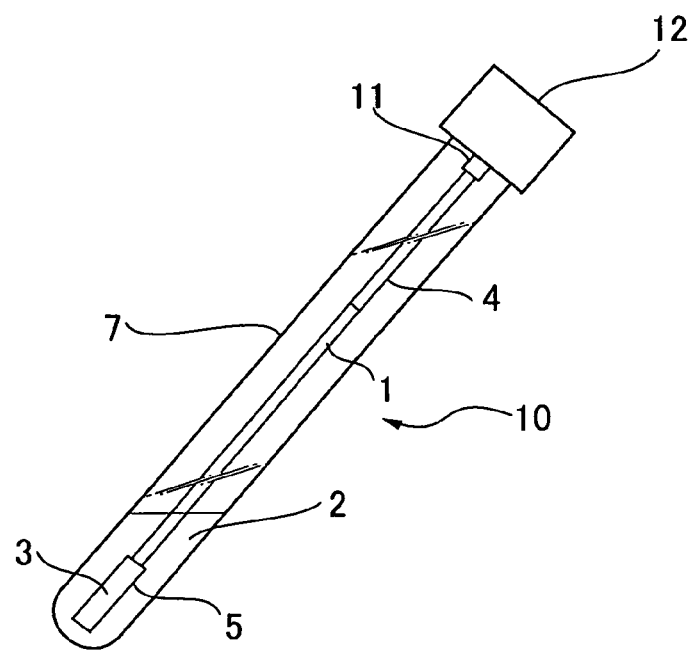
FIG. 2 is a schematic structural diagram showing a macromolecule-crystal forming device 10 according to one embodiment of the present invention.

With reference to FIG. 2 and the rest of the figures, various specific embodiments will be described below.

Firstly, a tubule or capillary 4 containing a sample of macromolecule (protein) is prepared. The macromolecule sample (protein solution) used in this embodiment is shown in Table 1. The capillary 4 in this embodiment is made of glass (length: 11 cm, inner diameter: 0.3 mm), and the protein solution is contained in a tubular inner space thereof. In this case, a given amount of protein solution is sucked in the capillary 4, and then one of the open ends of the capillary is sealed.

Then, a gel material [Agarose-III (product name), available from Wako Pure Chemical Industries, Ltd.] is prepared.

Figure 3:
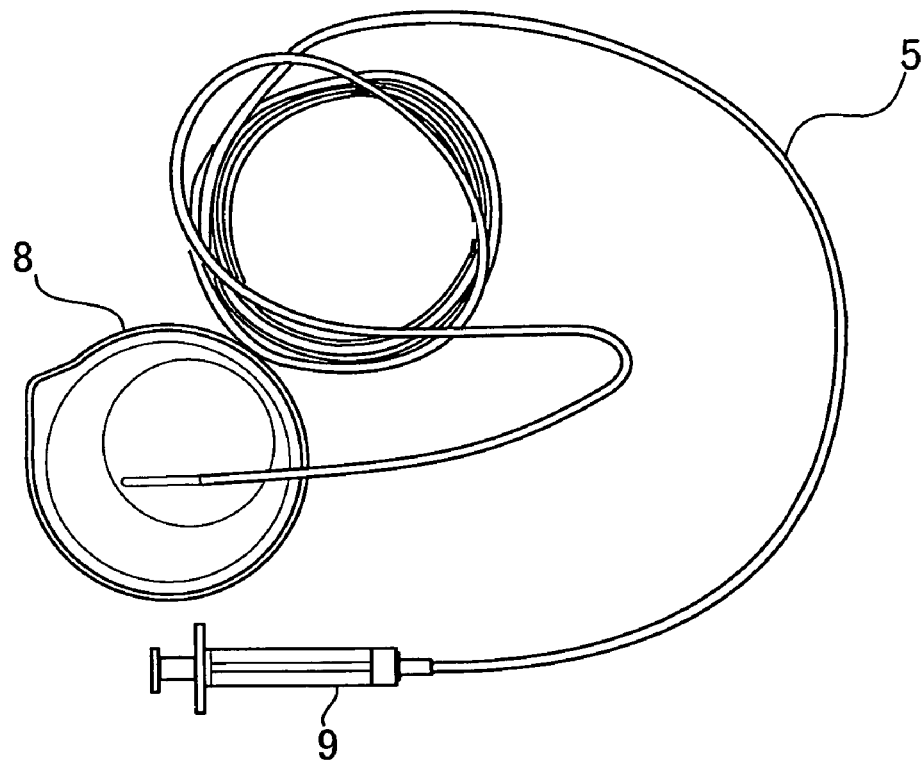
FIG. 3 is an explanatory diagram of a process for forming a silicon tube 5.

The gel material is boiled and dissolved in water or appropriate buffer solution to form a gel solution. Then, in this embodiment, a single long silicon tube 5 is prepared, and one of the open ends of the silicon tube 5 is immersed in a vessel 8 containing the gel solution, as shown in FIG. 3. A syringe 9 (made of polypropylene) is attached to the other open ends of the silicon tube 5, and then a plunger of the syringe 9 is pulled to induce a negative pressure in an inner space of the silicon tube 5. Thus, the inner space of the silicon tube 5 is filled with the gel solution. Then, the gel solution is cooled in the inner space of the silicon tube 5 to form the silicon tube 5 filled with a gel 3.

Figure 4:
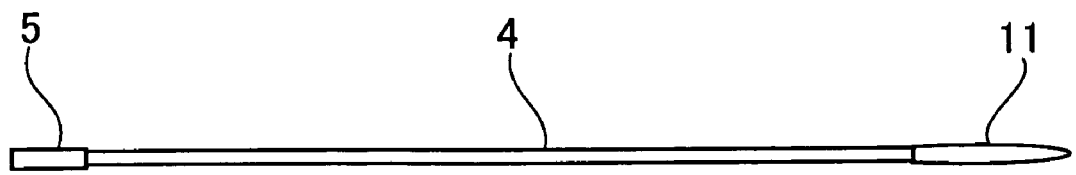
FIG. 4 is an external view showing a capillary 4 joined to the silicon tube 5.

In a process of assembling a macromolecule-crystal forming device 10, the gel-filled silicon tube 5 prepared in the above way is cut to a given length (about 15 mm). One of the ends of the silicon tube 5 cut to the given length is fitted onto the open end of the capillary 4 to connect them together, as shown in FIG. 4. This operation is performed while adequately taking account of preventing air bubbles from entering between the silicon tube and the tubule. If any air bubble enters therebetween, the gel-filled silicon tube is pulled out once, and re-fitted. When the gel-filled silicon tube 5 is adequately fitted onto the capillary 4, an interface between the protein solution and the gel is formed at the inserted end of the capillary 4. At the same time, a part of the solidified gel is pushed out of the other end of the silicon tube 5. The pushed-out gel is cut off with a cutter.

The silicon tube 5 has elasticity which allows the connection with the capillary 4 inserted into one end of the silicon tube 5 to be elastically maintained. The capillary 4 connected with the silicon tube 5 is set up to a third container or test tube 7 containing a precipitant solution 2. In this embodiment, a 15 ml volume, capped test tube (diameter: about 16 mm, length: about 130 mm, material of the tube: glass, material of the cap: melamine) is used as the test tube 7. About 3 ml of precipitant solution 2 is poured in the test tube 7, and then the capillary 4 connected with the cut silicon tube 5 is inserted into the test tube 7.

In this operation, the silicon tube 5 connected with the capillary 4 is incorporated into the test tube 7 in such a manner that the other end or open end of the silicon tube 5 is immersed in the precipitant solution 2. Thus, the gel is in contact with the precipitant solution 2 on the side of the open end of the silicon tube 5. The end of the capillary 4 in non-contact with the gel is hermetically sealed by a seal 11. The seal 11 may be formed using clay or grease. Alternatively, the seal 11 may be formed by thermally sealing the end of the capillary 4. Further, the open end of the test tube 7 is hermetically closed by a cap or plug 12.

This structure can prevent the vaporization of components of the protein solution 1 and the precipitant solution 2 to maintain their compositions homogeneously.

Table 1 shows the compositions of the protein solution and the precipitant solution. A crystallization temperature in each case is a room temperature.

TABLE 1

| | lysozyme | Taka-amylase |
|---|---|---|
| protein solution | 100 mg/ml hen egg white lysozyme solution/50 mM acetate buffer pH 4.5 | 90 mg/ml Taka-amylase solution/50 mM acetate buffer pH 6.0 |
| precipitant solution | 20% (w/v) sodium chloride/ 50 mM acetate buffer pH 4.5 | 40% (w/v) polyethylene glycol solution/50 mM acetate buffer pH 6.0) |
| crystallization temperature | room temperature | room temperature |

Figure 5:
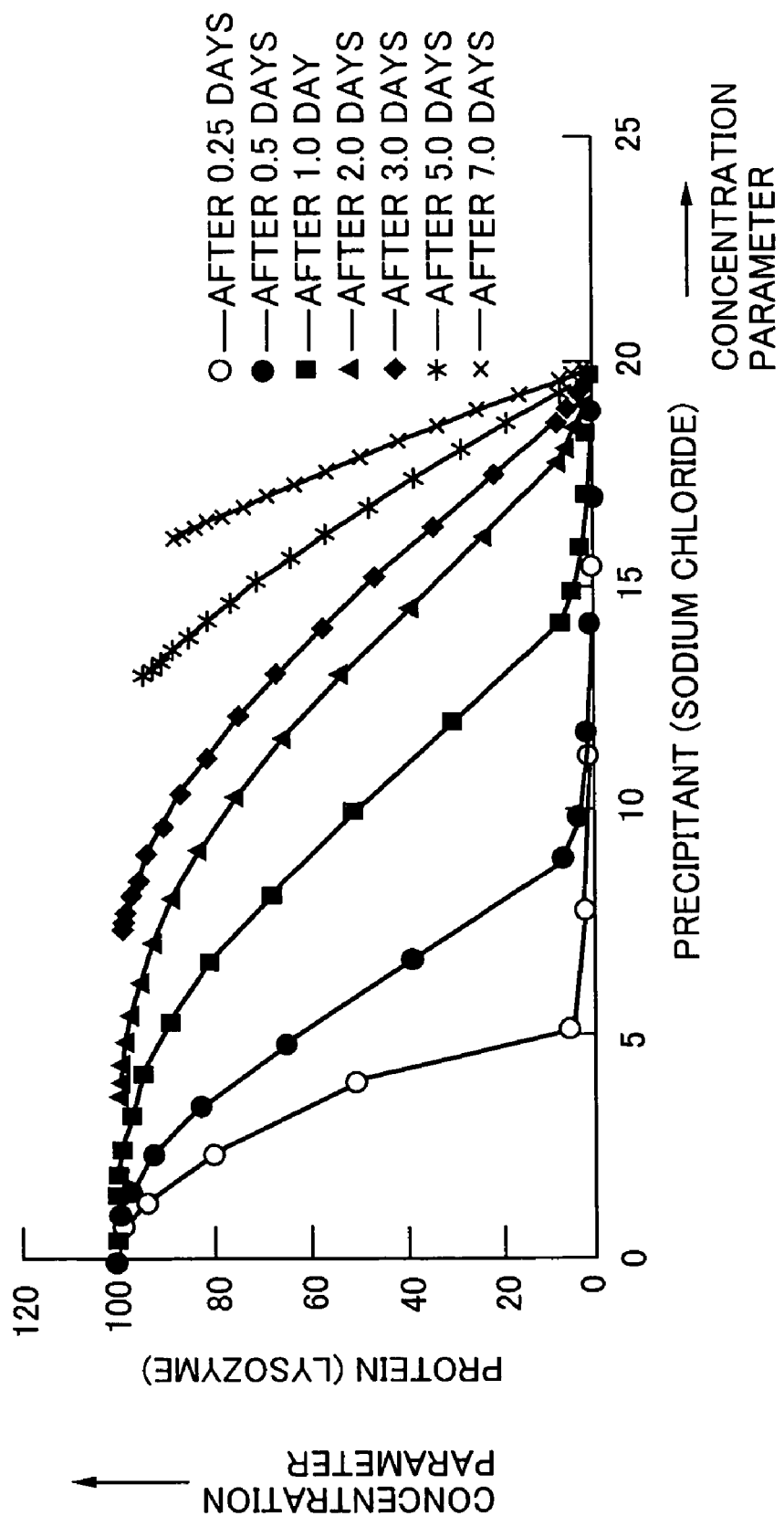
FIG. 5 is a graph showing a time-based variation in the respective concentrations of lysozyme used as a protein, and sodium chloride used as a precipitant.
Figure 6:
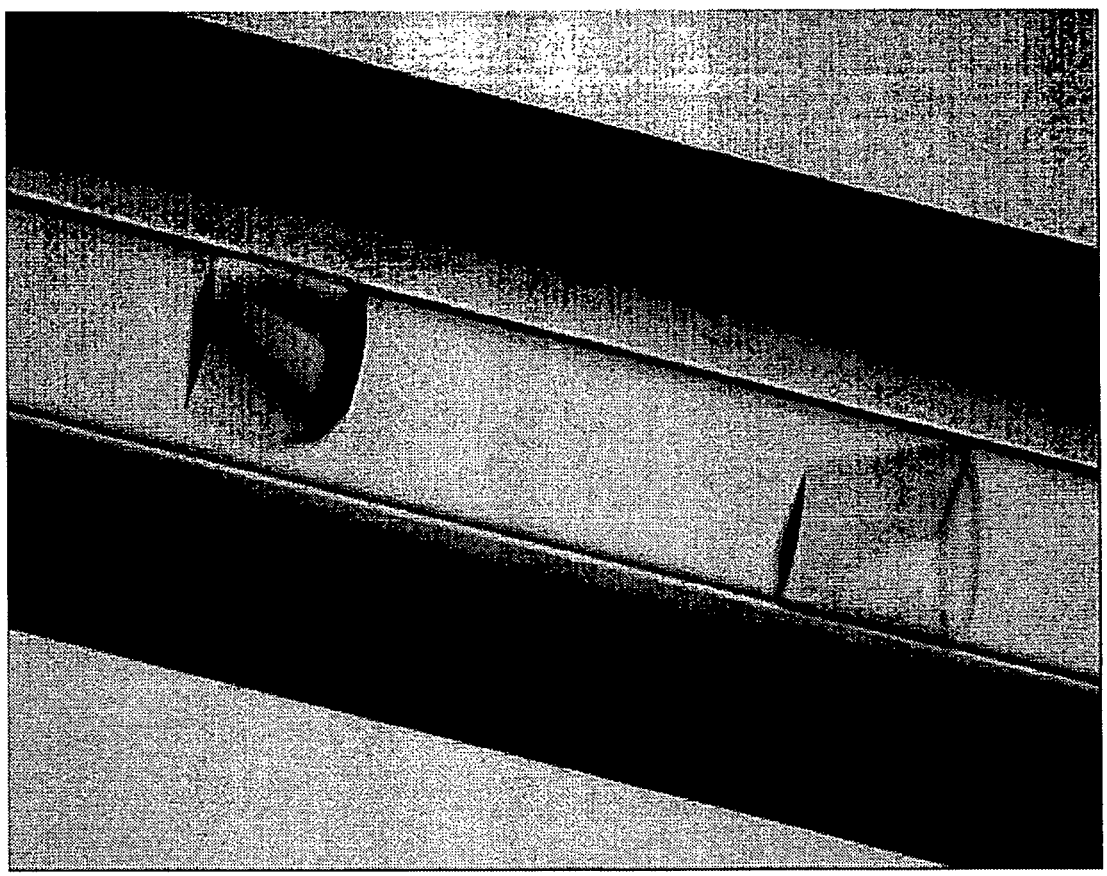
FIG. 6 is a photomicrograph of a formed lysozyme crystal.

FIG. 5 shows the simulation-based estimated result of a time-based variation in the respective concentrations of a protein and a precipitant, wherein the simulation is performed on the assumption that the macromolecule-crystal forming device 10 illustrated in FIG. 2 is used, lysozyme and sodium chloride being used, respectively, as the protein for forming a macromolecule sample or protein solution 1 and the precipitant for forming a precipitant solution 2, and the concentrations being measured along the longitudinal direction of the capillary 4 and the silicon tube 5. FIG. 6 is a photomicrograph of an actually formed crystal. In FIG. 5, 100 mg/ml of the lysozyme indicates a concentration at the edge of the capillary 4 fairly remote from the interface between the lysozyme of the protein solution 1 and the gel 3. Further, 20% of the precipitant solution indicates a concentration at the edge of the inner space of the silicon tube 5 on the side remote from the above interface. After about 6 hours from the setup of the crystal forming device, the deposition of a crystal was initiated at the edge of the capillary 4. Subsequently, within 24 hours, the initiation of crystallization was observed in the entire region of the capillary 4.

Figure 7:
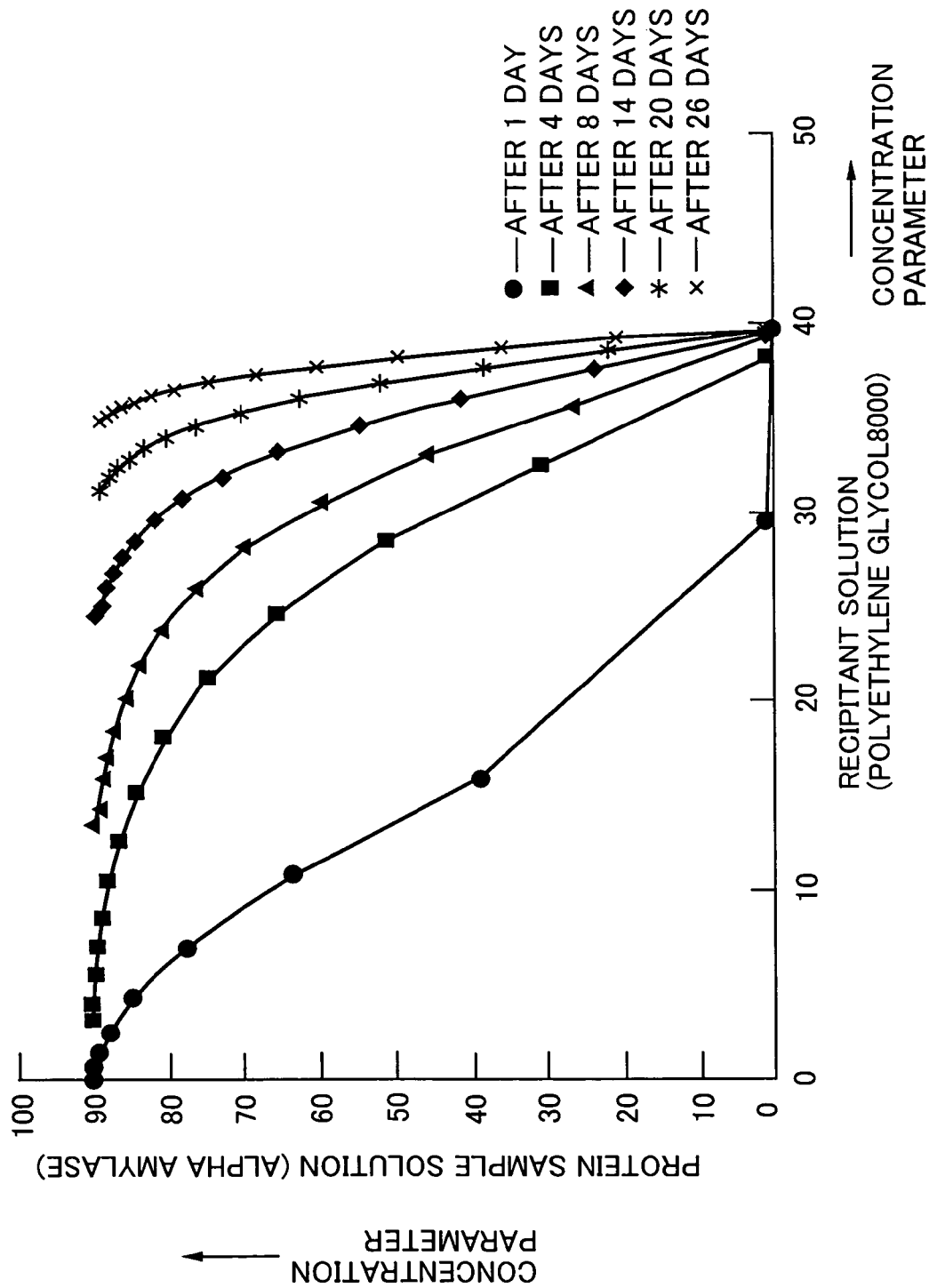
FIG. 7 is a graph showing a time-based variation in the respective concentrations of alpha amylase used as a protein, and polyethylene glycol used as a precipitant.
Figure 8:
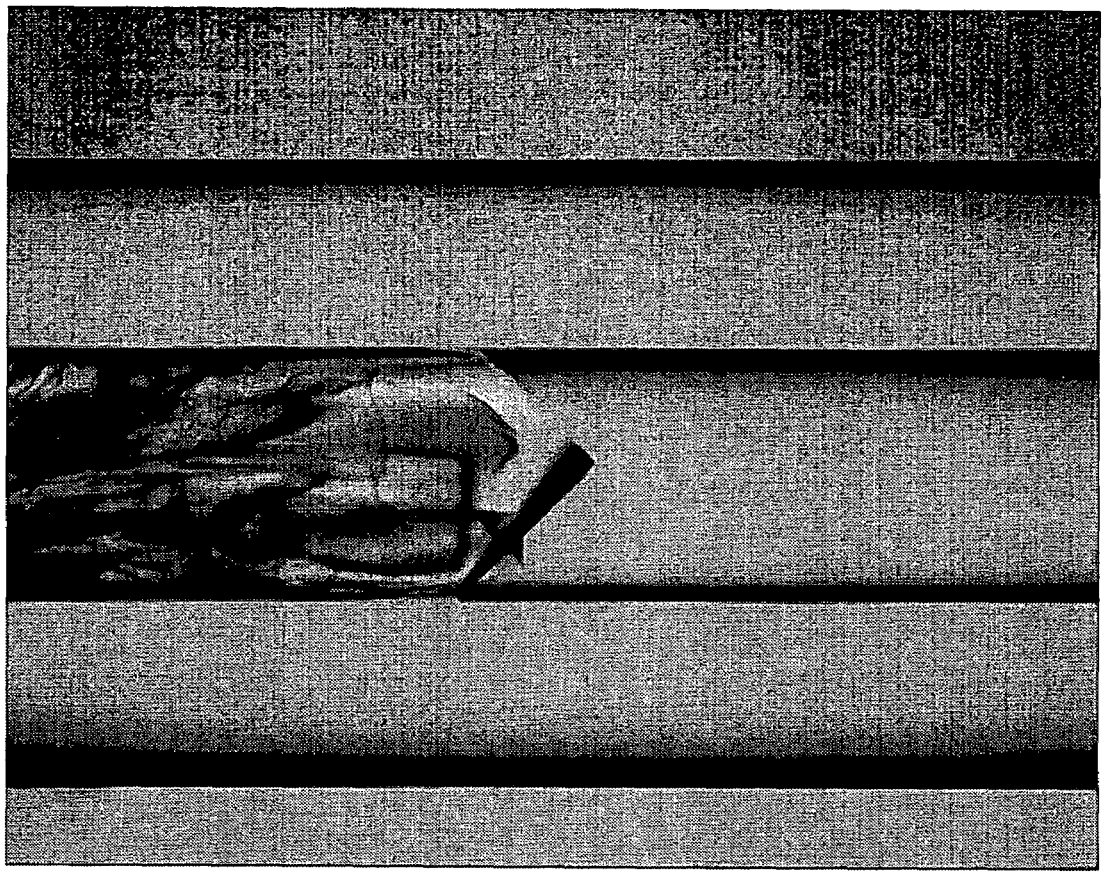
FIG. 8 is a photomicrograph of a formed alpha amylase crystal.

As with FIG. 5, FIG. 7 shows the simulation-based estimated result of a time-based variation in the respective concentrations of Taka-amylase used as a protein for forming a protein solution 1 and polyethylene glycol used as a precipitant for forming a precipitant solution 2, in the inner space of the capillary 4 along the longitudinal direction of the capillary 4 and the silicon tube 5. FIG. 8 is a photomicrograph of an actually formed crystal. In this case, after several days from the setup of the macromolecule-crystal forming device 10 having the structure in FIG. 2, the initiation of crystallization was observed in the inner space of the capillary 4.

According to the present invention, a macromolecule-crystal forming device having a desired gel and precipitant solution can be obtained quickly and readily in conformity to each of a plurality of capillaries 4 containing various macromolecule samples. The gel layer can also be supplied in a simplified and speedy manner to achieve enhanced efficiency of an experimental test on crystallization of macromolecules using a tubule.

In addition, the use of a gel-filled silicon tube allows the volume of the gel to be reduced. Thus, the diffusion of the precipitant solution into the tubule is accelerated to reduce a time-period until the crystallization is initiated, or a crystallization initiation period, as compared with a recently developed crystallization method using a gel layer. This is effective, particularly, in a case of using a precipitant solution having a low diffusion rate.

Further, a crystal can be formed with significantly high quality.

The respective concentrations of protein and precipitant solutions required for forming at least one crystal can be calculated in accordance with the estimated result of a time-based variation in the respective concentrations of the solutions, and the position and time of crystal formation in the capillary, and the calculation result can be used to optimize crystallization conditions.

A time-period required for completing the crystallization can also be calculated.

Various other crystal forming devices usable in the present invention will be described below.

Figure 9:
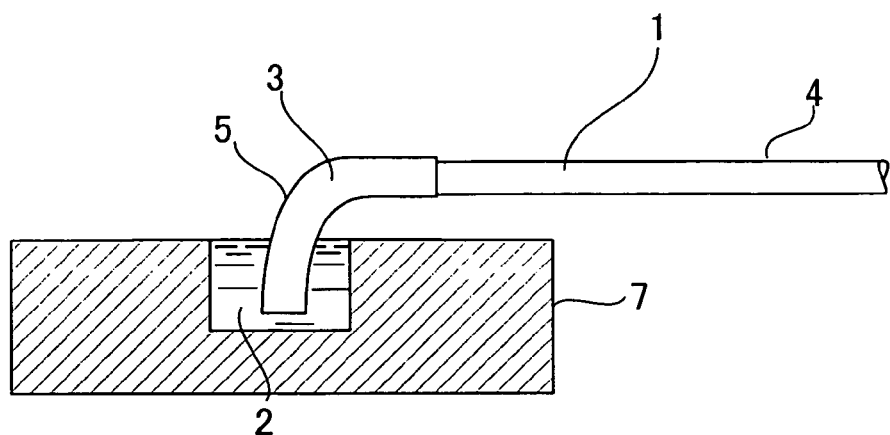
FIG. 9 is a schematic structural diagram showing a macromolecule-crystal forming device according to another embodiment of the present invention.

An embodiment illustrated in FIG. 9 comprises a plurality of capillaries 4, a plurality of curved silicon tubes 5 each attached to the front end of the corresponding capillary 4, and a container 7 containing a precipitant solution, which is composed of a multi-cell container, such as a type commonly used in a crystallization test based on a vapor diffusion process. After a precipitant solution is supplied into each of the cells, and the tubules 4 each containing a protein solution are inserted into the corresponding silicon tubes 5 each containing a gel 3, the lower end of each of the silicon tubes 5 is immersed in the corresponding cell. According to this embodiment, various crystallization tests can be performed at the same time in a simplified manner.

Figure 10:
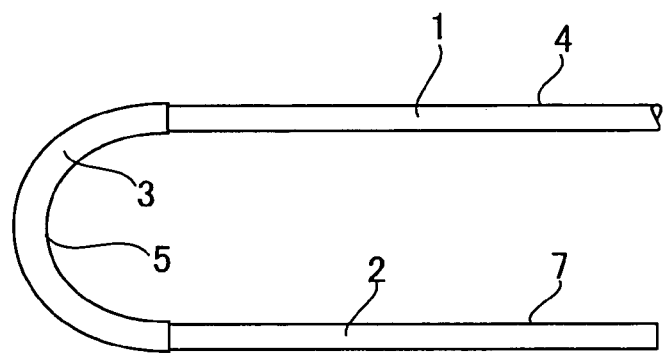
FIG. 10 is a schematic structural diagram showing a macromolecule-crystal forming device according to yet another embodiment of the present invention.

In another embodiment illustrated in FIG. 10, a capillary 4 containing a protein solution is inserted into one of the ends of a silicon tube 5 containing a gel 3, and a tubular container 7 filled with a precipitant solution 2 in a liquid or gel form is connected to the other end of the silicon tube 5. In this structure, the silicon tube 5 is designed to be elastically deformable. Thus, the relative positional relationship between the capillary 4 and the precipitant container 7 can be advantageously adjusted freely.

Figure 11:
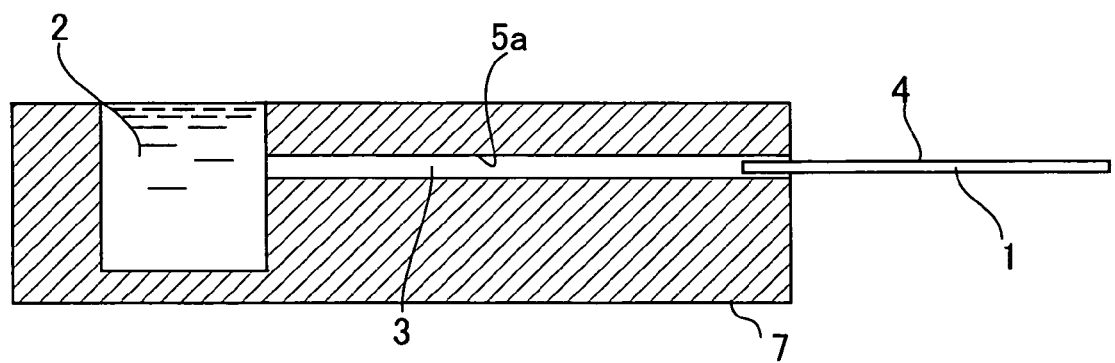
FIG. 11 is a schematic structural diagram showing a macromolecule-crystal forming device according to still another embodiment of the present invention.

In yet another embodiment illustrated in FIG. 11, a precipitant-solution container 7 and a gel container 3 are integrated together. Specifically, the container 7 is formed with a passage 5a filled with a gel in advance to serve as a gel container, and a precipitant reservoir in fluid communication with the passage 5a and adapted to reserve a precipitant solution 2. A capillary 4 filled with a protein solution 1 is inserted into and connected to one of the open ends of the passage 5a constituting a part of the container 7. In this manner, the contact between the gel and the precipitant is established through the other open end of the passage 5a in fluid communication with the precipitant solution reservoir.

Figure 12:
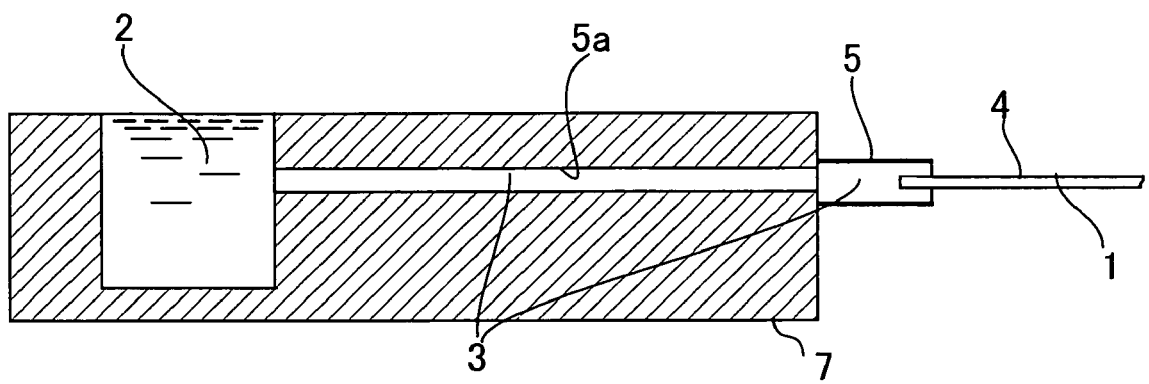
FIG. 12 is a schematic structural diagram showing a macromolecule-crystal forming device according to yet still another embodiment of the present invention.

In still another embodiment illustrated in FIG. 12, as with the embodiment illustrated in FIG. 11, a passage 5a is formed in a part of a container 7 having a precipitant solution reservoir, and a gel is filled and contained in the passage 5a. Then, a capillary 4 filled with a protein solution 1 is connected to a silicon tube 5 filled with a gel 3 as described in connection with FIG. 2, and the silicon tube 5 is attached to the outer end of the passage 5a, or gel-filled portion, of the container 7.

Figure 13:
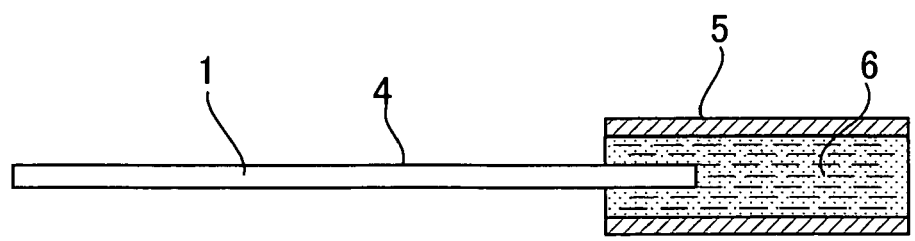
FIG. 13 is a schematic structural diagram showing a macromolecule-crystal forming device according to another further embodiment of the present invention.

In yet still another embodiment illustrated in FIG. 13, a gelatinized precipitant solution 6 prepared by mixing a gel and a precipitant solution is filled in a silicon tube 5, and a capillary 4 containing a protein solution 1 is inserted into the silicon tube 5.

With reference to FIGS. 14 to 20, another further embodiment of the present invention will be described.

Figure 14:
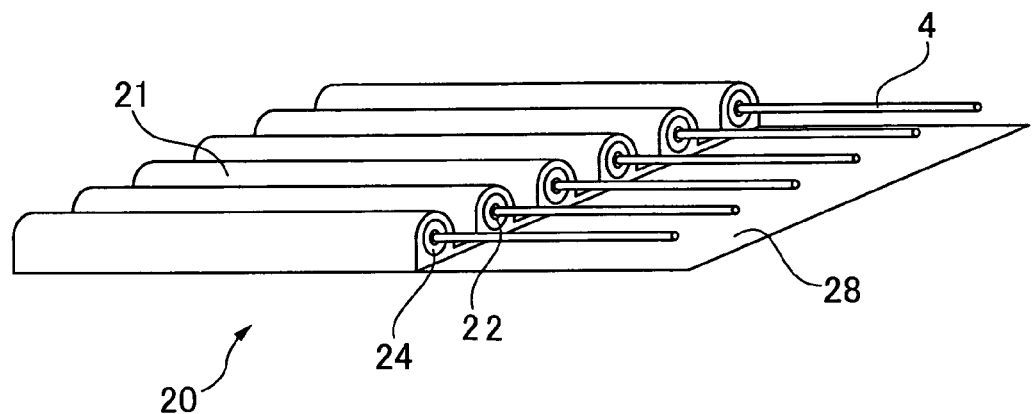
FIG. 14 is a perspective view showing a syringe case unit 20 of a macromolecule-crystal forming device according to still a further embodiment of the present invention.
Figure 15:
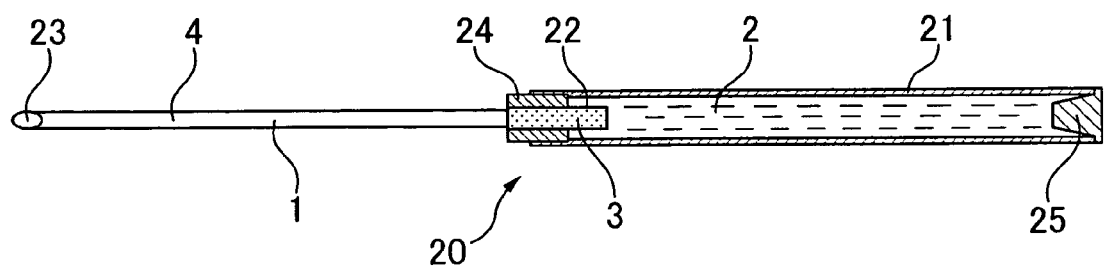
FIG. 15 is a sectional view showing one of macromolecule-crystal forming cells 10 incorporated in the syringe case unit 20.
Figure 16:
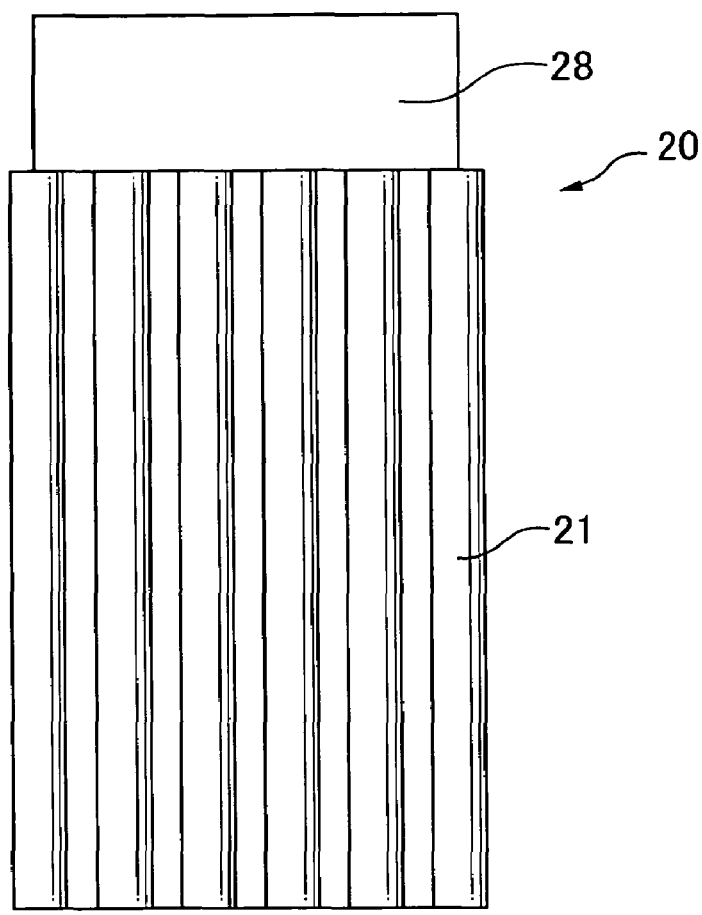
FIG. 16 (a) is a top plan view of the syringe case unit 20.
Figure 16:
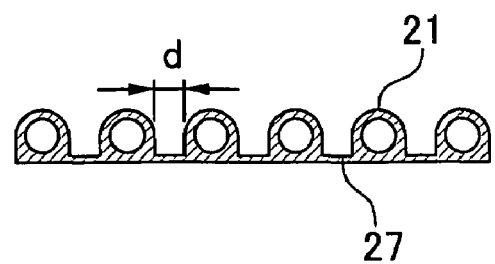

In this embodiment, a macromolecule-crystal forming device 10 comprises a plurality of macromolecule-crystal forming cells integrally connected with each other. Specifically, in this embodiment, the macromolecule-crystal forming device 10 includes a syringe case unit 20 formed by integrally connecting the plurality of precipitant solution-containing containers 7 as described in the aforementioned embodiments. This embodiment is characterized in that the plurality of precipitant solution-containing containers or syringe cases 21 are integrated together to form the syringe case unit 20 having a unique configuration. FIG. 14 is a perspective view of the syringe case unit 20. This embodiment has six macromolecule-crystal forming cells integrally connected with each other. Further, the syringe case unit 20 in this embodiment has six cylindrical syringe cases 21 each having a given length, and these cylindrical syringe cases 21 are arranged in parallel at given intervals. Referring to FIG. 15, one of the macromolecule-crystal forming cells incorporated in the syringe case unit 20 is illustrated in sectional view.

Figure 17:
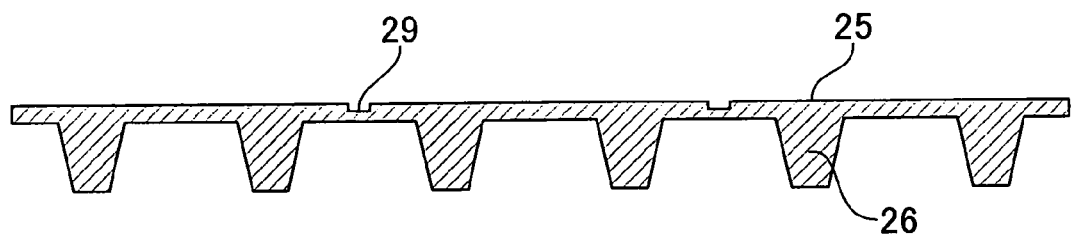
FIG. 17 (a) is a sectional view of a cap 25.
Figure 17:
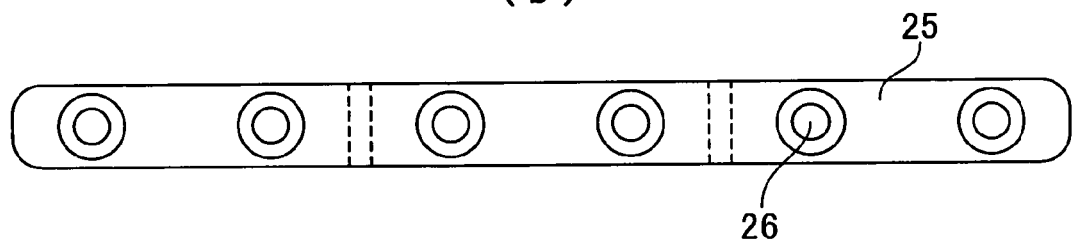

The cell includes a capillary 4 filled with a protein solution 1. In this embodiment, as a substitute for the silicon tube 5, a polyimide tube 22 is used as a second container containing a gel. This allows the container to be further reduced in size. One of the ends of the capillary 4 is inserted into one of the ends of the polyimide tube 22 containing a gel. The other end of the capillary 4 on the opposite side of the connected portion between the capillary 4 and the polyimide tube 22 is hermetically sealed by grease 23. The assembled unit of the capillary 4 and the polyimide tube 22 is fitted into each of the syringe cases 21 through a PVC tube 24 covering over the outer surface of the polyimide tube 22. Each of the syringe cases 21 is filled with a precipitant solution 1. In this embodiment, each of the syringe cases 21 has a cylindrical shape with an opening at each of the first and second opposite ends thereof. The opening of the first end is closed by the assembled unit of the capillary 4 filled with the protein solution 1 and the polyimide tube 22 filled with the gel, which is inserted thereinto through the PVC tube 24, and the opening of the second end is closed by a cap 25. Additionally referring to FIGS. 16(a), 16(b), 17(a) and 17(b), FIGS. 16(a) and 16(b) are a top plan view and a sectional view of the syringe case unit 20, respectively. As seen in these figures, the syringe cases 21 are integrally formed with a backing plate 27 to allow the adjacent syringe cases 21 to be arranged at a constant interval. This backing plate 27 has a guide portion 28 for guiding the assembled unit of the capillary 4 and the polyimide tube 22 during an operation of inserting the assembled unit into each of the syringe cases 21. The guide portion 28 is formed by extending the plate 27 beyond the first ends of the syringe cases 21. The interval or distance between the adjacent syringe cases 21 is set at a constant value slightly greater than the outer diameter of each of the syringe cases 21. As shown in FIGS. 17(a) and 17 (b), the cap 25 has a convex portion 26 to be inserted into a corresponding one of the cells, and six of the convex portions 26 are arranged at intervals corresponding to the cells. These caps 25 are integrally formed in a single piece in such a manner that the six convex portions are located in opposed relation to the corresponding openings of the six syringe cases 21.

In this embodiment, the capillary 4 has a length of 55 mm, an inner diameter of 0.5 mm and an outer diameter of 1.25 mm. The polyimide tube has a length of 12 mm, and the PVC tube has a length of 5 mm.

A process of assembling the macromolecule-crystal forming device 10 to be formed by integrally connecting the six cells, according to the above embodiment, will be described below. In advance of assembling, a gel is filled in the polyimide tube (in the same manner as that in the aforementioned embodiments). The convex portions of the caps 25 are fitted into the corresponding openings in the second ends of the syringe cases 21 of the syringe case unit 20 to hermetically seal the openings, and then a precipitant solution is filled in the syringe cases 21. Then, a polyimide tube filled with a gel is cut to a given length (12 mm in this embodiment as described above). A PVC tube is also cut to a given length (5 mm). Grease is applied to one end, or first end, of a capillary to make ready to hermetically seal the first end of the capillary 4 (in this stage, the first end is maintained in an open state). The PVC tube 24 is fitted onto the other end, or second end, of the capillary 4. A protein solution is sucked into and filled in the capillary 4. Then, the first end of the capillary 4 is hermetically sealed by high vacuum grease. Then, the polyimide tube 22 filled with the gel and cut to the given length is inserted into the second end, or the non-grease-sealed end, of the capillary 4. Through this operation, the protein solution in the capillary 4 is brought into contact with the gel in the polyimide tube 22. Then, the PVC tube 24 is slidingly moved to cover the outer surface of the polyimide tube 22. In this state, the assembled unit of the capillary 4 and the polyimide tube 22 is inserted into each of the syringe cases 21. During this operation, the assembled unit of the capillary 4 and the polyimide tube 22 can be slidingly inserted into the opening of the syringe case 21 by use of the guide portion 28 formed in the syringe case unit, to provide enhanced efficiency and reliability in the insertion operation. The polyimide tube 22 used in this process has an outer diameter of 1.2 mm and a wall thickness of 0.006 mm, and the PVC tube 24 used in this process has an outer diameter of 2 mm and a wall thickness of 0.5 mm. As mentioned above, each of these tubes is prepared by cutting a single long tube to a given length.

Figure 18:
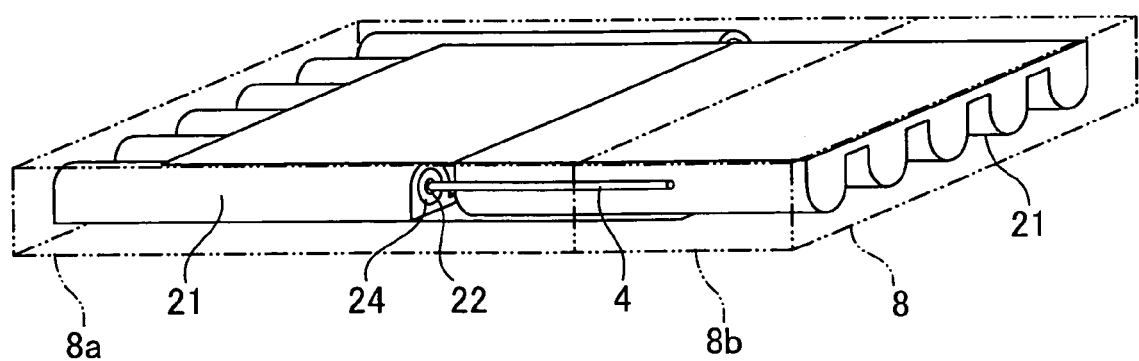
FIG. 18 is a perspective view showing the state after two of the syringe case units 20 are stored in a storage box in a partly superimposed manner.

Referring to FIG. 18, two of the syringe case units 20 each incorporating the assembled unit of the capillary 4 and the polyimide tube 22 are located in face-to-face contact with one another in a partially superimposed manner, as illustrated, to allow them to be stored in a space-saving manner. As mentioned above, the interval between adjacent syringe cases 21 is set at a value slightly greater than the outer diameter of each of the syringe cases 21. Thus, each of the syringe cases 21 of one of the syringe case units 20 can be located within a corresponding one of the intervals of the other syringe case unit 20. Thus, two of the syringe case units 20 each incorporating a given number of complete macromolecule-crystal forming cells can be disposed opposed to one another in such a manner that the edge of each of the capillaries of one of the syringe case units is located between the adjacent syringe cases 21 of the other syringe case unit, and the respective backing plates 27 are located outward, so as to allow the two syringe case units 20 to be stored within a space having a length of two times of that of the syringe case 21. In this manner, a number of cells can be stored in a space-saving manner. Thus, in a crystallization test to be performed under circumstances having extremely hard spatial restrictions, for example a protein-crystal forming test in outer space, the macromolecule-crystal forming device according to this embodiment has an extremely valuable advantage in allowing various tests to be performed with significantly enhanced efficiency.

In this embodiment, two of the syringe case units 20 reversely oriented in the longitudinal and vertical directions and partially superimposed on one another are stored in a single storage box 8, as described above. As shown in FIG. 18, in this embodiment, one syringe case unit 20 having six cells is stored in a body portion 8a of the storage box 8, and the other syringe case unit 20 having five cells is stored in a cover portion 8b of the storage box 8.

Figure 19:
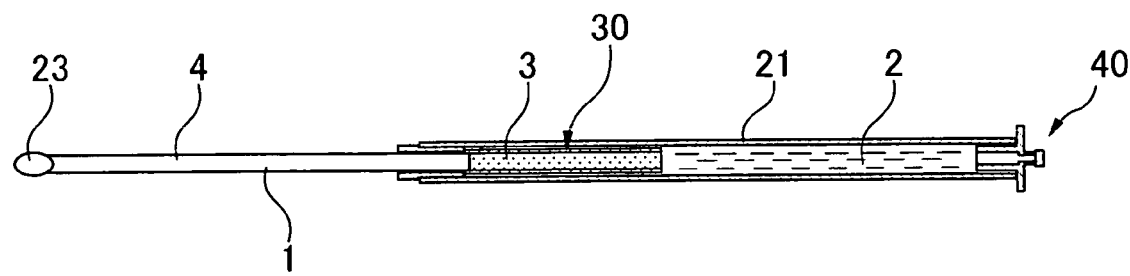
FIG. 19 is a sectional view showing one of macromolecule-crystal forming cells 10 incorporated in a syringe case unit 20 of a macromolecule-crystal forming device according to an additional embodiment of the present invention.
Figure 20:
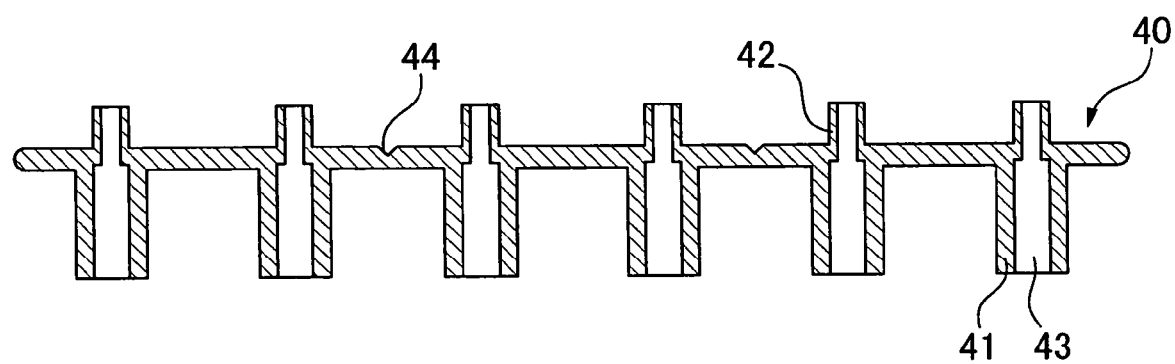
FIG. 20 is a sectional view of a cap 40.
Figure 21:
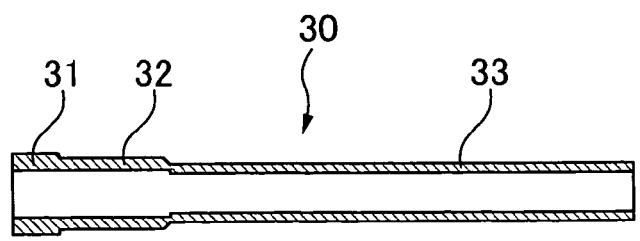
FIG. 21 is a sectional view of a bush 30.

Referring to FIGS. 19 to 21, a macromolecule-crystal forming device 10 according to still a further embodiment of the present invention is illustrated.

In this embodiment, as a substitute for the polyimide tube 22 in the foregoing embodiment, a second container to be filled with a gel is composed of a bush 30 having three cylindrical portions different in outer diameter, and two cylindrical portions different in inner diameter. That is, the bush 30 has a large outer-diameter portion 31, an intermediate outer-diameter portion 32, and a small outer-diameter portion 33. The large outer-diameter portion 31 and the intermediate outer-diameter portion 32 have a large inner-diameter portion, and the small outer-diameter portion 33 corresponds to a small inner-diameter portion. While each of the caps 25 in the foregoing embodiment has the convex portion 26 corresponding to the opening of the syringe case, each of caps 40 in this embodiment 40 has a fit portion 41 protruding in such a manner as to be inserted into the opening, a protruded portion 42 extending in a direction opposite to the fit portion 41, and a communication hole 43 providing fluid communication between the respective inner spaces of the protruded portion 42 and the fit portion 41, as shown in FIG. 20.

As with the caps 25 in the foregoing embodiment, the unit of the caps 40 in this embodiment is formed with notches 44 for allowing the caps to be readily detached from the corresponding cells individually.

A process of assembling the macromolecule-crystal forming device according to this embodiment will be described below. A gel is filled in the bush 30 in advance. A precipitant solution is filled in each of the syringe cases 21, and the caps 40 are fitted into the openings of the second ends of the corresponding syringe cases 21. Then, a protein solution is filled in the capillary 4. Then, in the same manner as that in the foregoing embodiment, grease is applied to one end, or first end, of a capillary 4. The first end of the capillary 4 is hermetically sealed by high vacuum grease. The capillary 4 is inserted into the bush 30 to integrate the capillary 4 filled with the protein solution with the bush 30 filled with the gel. This assembled unit is inserted from the side of the small outer-diameter portion 33 of the bush 30 into each of the syringe cases 21. As the result of this operation, a part of the precipitant solution in the syringe cases 21 is pushed out from openings 43 of the caps 40. In this operation, during the course of inserting the assembled unit of the capillary 4 filled with the protein solution and the bush 30 filled with the gel from the side of the bush 30, the inner space of the syringe case is compressed from the first end thereof to press the precipitant solution therein. Thus, it is required to assure an escape route for the precipitant solution. In this embodiment, the presence of the opening 43 formed in each of the caps 40 to provide fluid communication between the inner space of each of the syringe cases 21 and the outside makes it possible to adequately discharge an excessive part of the precipitant solution through the opening 43 in response to the insertion of the assembled unit into the inner space of the syringe case. Thus, the assembled unit of the capillary 4 and the bush 30 can be inserted into each of the syringe cases 21 while adequately maintaining the filling condition of the precipitant solution in the syringe case. Then, the opening 43 of each of the protruded portion 42 is thermally sealed. In this state, crystallization is promoted.

Table 2 shows test conditions using the device according to this embodiment, wherein lysozyme and sodium chloride are used as the protein solution and the precipitant solution, respectively.

TABLE 2

| | lysozyme |
|---|---|
| protein solution | 120 mg/ml hen egg white lysozyme/100 mM acetate buffer pH 4.5 (10 µL) |
| precipitant solution | 10% (w/v) sodium chloride/100 mM acetate buffer pH 4.5 (150 µL) |
| crystallization temperature | room temperature (293 K) |
| test result | After 4 to 6 days from the start of a crystallization test, crystal formation is initiated at 2 to 5 mm from the lower end of the capillary. |

Figure 22:
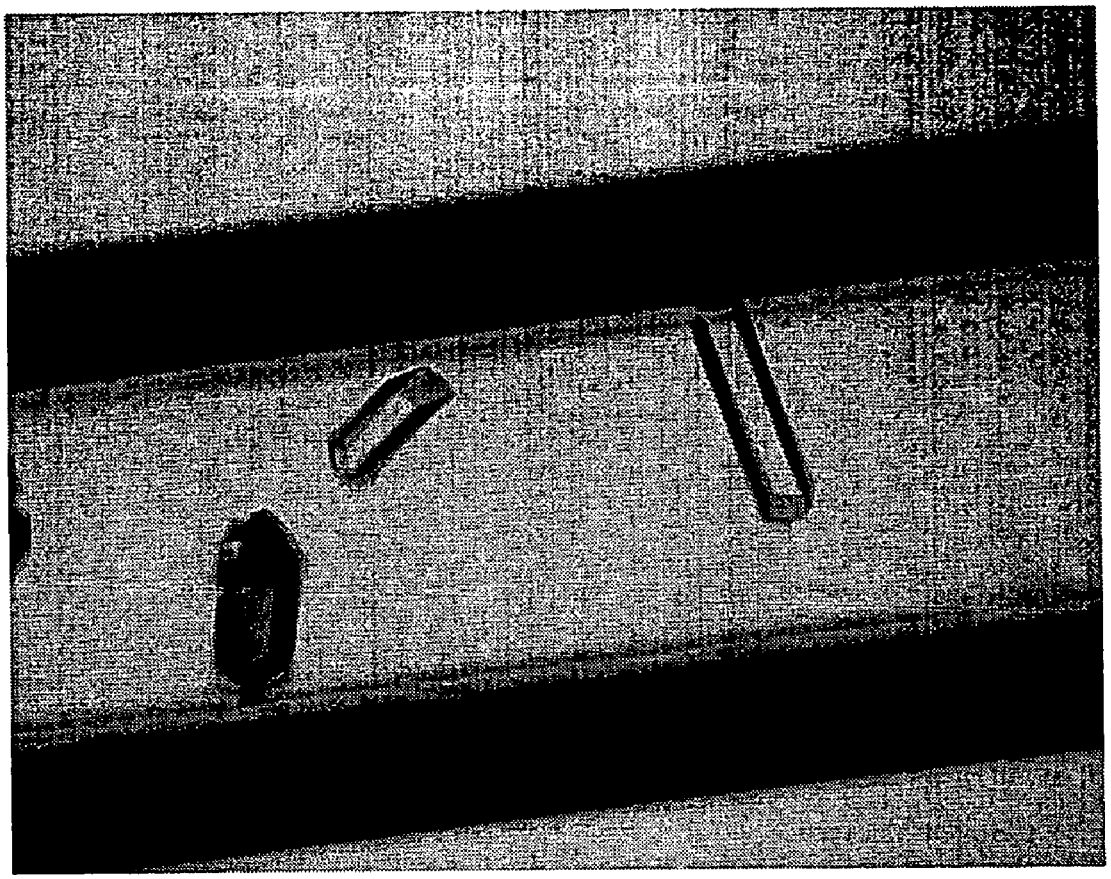
FIG. 22 is a photomicrograph of a formed lysozyme crystal.

FIG. 22 is a photomicrograph showing a lysozyme crystal formed using the device according to this embodiment.

Figure 23:
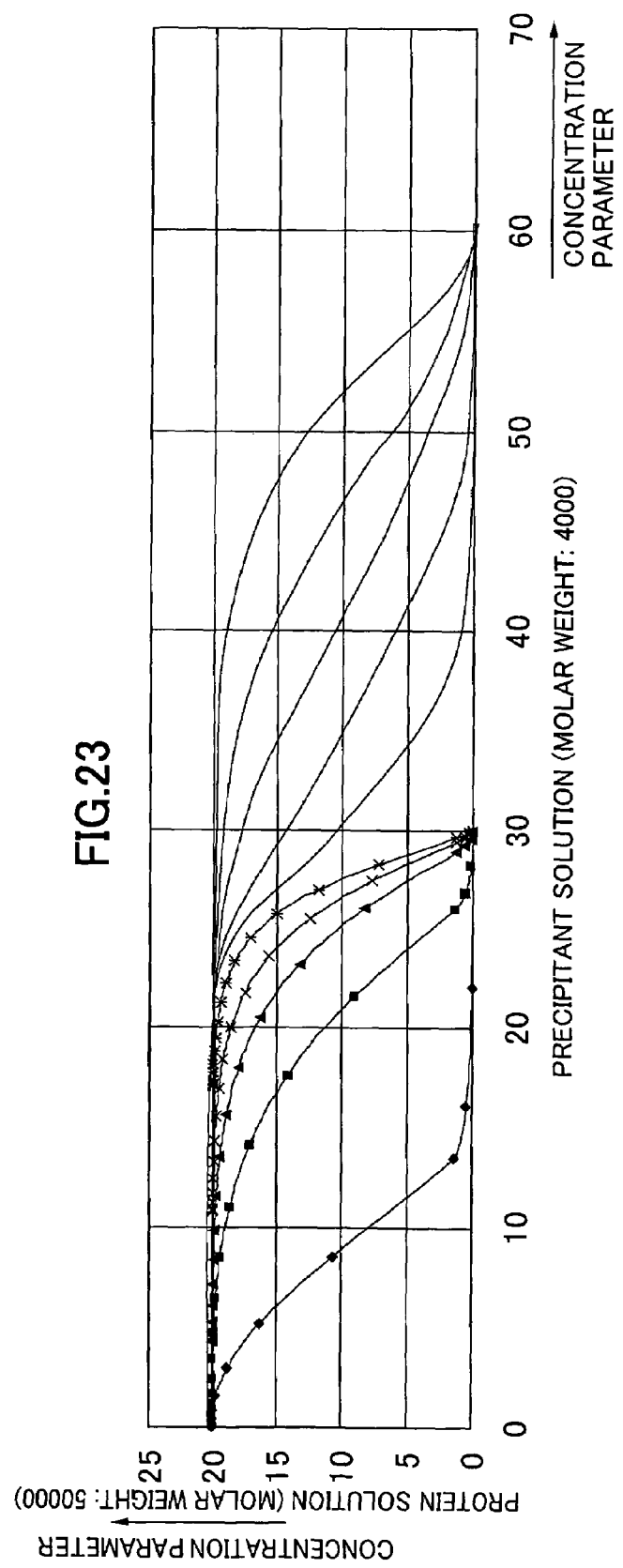
FIG. 23 is a graph showing a time-based variation in the respective concentrations of a protein and a precipitant, wherein the concentration of the precipitant is changed after a lapse of a given time from the initiation of operation of the macromolecule-crystal forming device in FIG. 19.

Referring to FIG. 23, a graph is illustrated in a chart form that shows a time-based variation in the respective concentrations of the protein solution and the precipitant solution, in the same manner as that in FIGS. 5 and 7. That is, the graph shows the variation in the respective concentrations of the protein solution and the precipitant solution in the longitudinal direction of the capillary 4 and the bush 30 filled with the gel. The vertical axis represents a parameter indicative of the concentration of the protein solution, and the horizontal axis represents a parameter indicative of the concentration of the precipitant solution. In FIG. 23, it is observed that the characteristic curves converge at a position where the precipitant solution has a concentration parameter of zero, and the protein solution has a concentration parameter of 20. This means that the position corresponds to a portion of the protein solution located on the side of the sealed end 23 of the capillary. It is also observed that the characteristic curves converge at a position where the precipitant solution has a concentration parameter of 30, and the protein solution has a concentration parameter of zero. This means that the position corresponds to the connected point between the precipitant solution portion 21 and the gel portion 30.

When a precipitant solution having a concentration parameter of 30 in FIG. 23 is used, it is difficult to allow each of the concentrations of protein and precipitant solutions to have a value close to their initial concentration even after a lapse of long times. Further, it is likely that a certain protein can be crystallized only in such concentration conditions of these solutions. In this case, the conventional device has great difficulties in providing crystallization conditions for such a protein. Through various researches in view of this circumstance, the inventors found that crystallization conditions for such a protein can be provided by use of the cap 40 with an opening to be attached to the rear end of the syringe case 21. Specifically, the inventers were designed to allow the precipitant solution to be changed or replaced through the opening 43 in FIG. 20 so as to provide wider crystallization conditions. More specifically, a process of replacing a part or all of the precipitant solution after a lapse of a given time from the initiation of the contact between the gel and the precipitant solution in the above device, or after the initiation of the crystallization phenomenon of a protein, is additionally provided. In this case, a third container or syringe case 21 is formed with a through-hole at the second end on the other side of the first end in contact with the gel, and the cap 40 attached to this through-hole is detached to perform the replacement of the precipitant solution. After the cap 40 is attached again, the through-hole 43 will be appropriately sealed if the crystallization phenomenon is induced. When a portion of the third container having the through-hole is made of a polymeric material, the sealing is typically performed through a thermal fusion bonding process. Alternatively, the through-hole may be hermetically sealed by use of a plug.

For example, a macromolecule-crystal forming device having a structure as shown in FIG. 19 is constructed by using a protein solution having a given concentration and a precipitant solution having a given concentration, and crystallization is promoted for a given time-period (e.g. one week). Then, a high-concentration precipitant solution is filled in the inner space of the syringe case 21 through the cap 40 to allow the obtained precipitant solution to have a concentration parameter of 60. When the concentration of the precipitant solution is increased (a concentration parameter is increased from 30 to 60 in this embodiment) through the cap 40 after a lapse of a give time from the initiation of the crystallization, a plurality of concentration characteristic curves extending beyond the line of a precipitation-solution concentration parameter of 30 are formed as shown in FIG. 23. Thus, concentration conditions for both the protein and precipitant solutions, which are hardly achieved by the combinations of initial concentrations of the protein and precipitant solutions, can be provided quickly and readily by use of the macromolecule-crystal forming device having the structure in FIG. 19.

INDUSTRIAL APPLICABILITY

As mentioned above, according to the present invention, a macromolecule crystal can be formed using liquid-liquid diffusion through a gel in a simplified and efficient manner.

In particular, according to the present invention, even in a case where it is required to prepare numbers and various types of samples, a macromolecule-crystal forming device having a desired gel and precipitant solution corresponding to a desired macromolecule solution can be obtained quickly and readily. In this case, the gel layer can be supplied in a simplified and speedy manner to achieve enhanced efficiency of an experimental test on crystallization of macromolecules using a tubule.

In addition, the use of a gel-filled silicon tube in one embodiment of the present invention allows the volume of the gel to be reduced as compared to the conventional device. Thus, the diffusion of the precipitant solution into the tubule can be accelerated to reduce a crystallization initiation period, as compared with the conventional crystallization method using a gel layer. In an actual test on lysozyme, while crystallization in the conventional method is initiated after about 7 days, the present invention allows crystallization to be initiated after about 6 hours. In another actual test on Taka-amylase, while crystallization in the conventional method is initiated after about 10 days, the present invention allows crystallization to be initiated after about 3 days. Thus, the present invention is effective, particularly, in a case of using a precipitant solution having a low diffusion rate. Further, the present invention can form a crystal with significantly high quality.

What is claimed is:

1. A method for forming a macromolecule crystal, comprising the steps of:
    providing a first container which has at least one opening and contains a sample of macromolecule;
    providing a second container which has at least two openings and contains a gel for buffering a crystallization solution condition, a crystallization initiation period and a crystal-growth rate of the macromolecule;
    connecting said first and second containers through the opening of said first container and a first one of the openings of said second container to allow the macromolecule sample and the gel to be brought into contact with one another;
    providing a third container which contains a precipitant solution to be brought into contact with the macromolecule sample via a liquid-liquid diffusion process so as to facilitate the crystallization of the macromolecule; and
    allowing the gel in said second container to be brought into contact with the precipitant solution through a second one of the openings of said second container while maintaining the contact between the macromolecule sample in said first container and the gel in said second container.

2. The method as defined in claim 1, which further includes the steps of:
    providing an elongated tube material which has opposite open ends;
    supplying said macromolecule sample from one of the open ends of said tube material to the inside of said tube material; and
    cutting said tube material to a given length to form said first container.

3. The method as defined in claim 2, which further includes the step of:
    connecting one of the open ends of said tube material to a storage tank containing said macromolecule sample, and connecting a vacuum pump to the other open end to form a negative pressure in the inside of said tube material, so that the macromolecule sample is supplied to the inside of said tube material according to said negative pressure.

4. The method as defined in claim 2, which further includes the step of:
    connecting a pump filled with said macromolecule sample to one of the open ends of said tube material, and activating said pump to supply the macromolecule sample to the inside of said tube material.

5. The method as defined in claim 1, which further includes the steps of:
    providing, an elongated tube material which has opposite open ends;
    supplying said gel from one of the open ends of said tube material to the inside of said tube material; and
    cutting said tube material to a given length to form said second container.

6. The method as defined in claim 5, which further includes the step of:
    connecting one of the open ends of said tube material to a storage tank containing said gel, and connecting a vacuum pump to the other open end to form a negative pressure in the inside of said tube material, so that the gel is supplied to the inside of said tube material according to said negative pressure.

7. The method as defined in claim 5, which further includes the step of:

connecting a pump filled with said gel to one of the open ends of said tube material, and activating said pump to supply the gel to the inside of said tube material.

8. The method as defined in claim 7, wherein said tube material has elasticity.

9. A method for forming a macromolecule crystal, comprising the steps of:

providing a first container which has at least one opening and contains a sample of macromolecule;

providing a second container which has at least two openings and contains a buffer material for buffering a crystallization solution condition, a crystallization initiation period and a crystal-growth rate of the macromolecule;

connecting said first and second containers through the opening of said first container and a first one of the openings of said second container to allow the macromolecule sample and the buffer material to be brought into contact with one another;

providing a third container which contains a precipitant solution to be brought into contact with the macromolecule sample via a liquid-liquid diffusion process so as to facilitate the crystallization of the macromolecule, and allowing the buffer material in said second container to be brought into contact with the precipitant solution through a second one of the openings of said second container while maintaining the contact between the macromolecule sample in said first container and the buffer material in said second container.

10. A method for forming a macromolecule crystal, comprising the steps of:

providing a first container which has at least one opening and contains a sample of macromolecule;

providing a second container which has at least two openings and contains a porous material for buffering a crystallization solution condition, a crystallization initiation period and a crystal-growth rate of the macromolecule;

connecting said first and second containers through the opening of said first container and a first one of the openings of said second container to allow the macromolecule sample and the porous material to be brought into contact with one another;

providing a third container which contains a precipitant solution to be brought into contact with the macromolecule sample via a liquid-liquid diffusion process so as to facilitate the crystallization of the macromolecule; and allowing the porous material in said second container to be brought into contact with the precipitant solution through a second one of the openings of said second container while maintaining the contact between the macromolecule sample in said first container and the porous material in said second container.

11. A method for forming a macromolecule crystal, comprising the steps of:

providing a first container which has at least one opening and contains a sample of macromolecule;

providing a second container which has at least two openings and contains a gel for buffering the crystallization of the macromolecule;

connecting said first and second containers through the opening of said first container and a first one of the openings of said second container to allow the macromolecule sample and the gel to be brought into contact with one another;

providing a plurality of third containers integrally connected with each other, each of said third containers containing a precipitant solution to be brought into contact with the macromolecule sample via a liquid-liquid diffusion process so as to facilitate the crystallization of the macromolecule; and allowing the gel in said second container to be brought into contact with the precipitant solution through a second one of the openings of said second container while maintaining the contact between the macromolecule sample in said first container and the gel in said second container.

12. The method as defined in claim 11, which further includes the steps of;

forming each of said third containers to have an opening for communication or connection with said second container, and an additional opening provided with a detachable sealing cap; and performing the adjustment and replacement of the precipitant solution through said additional opening.

13. A method for forming a macromolecule crystal, comprising the steps of:

providing a first container which has at least one opening and contains a sample of macromolecule;

providing a second container which has at least two openings and contains a gel for buffering the crystallization of the macromolecule;

connecting said first and second containers through the opening of said first container and a first one of the openings of said second container to allow the macromolecule sample and the gel to be brought into contact with one another;

providing a plurality of third containers integrally connected with each other, each of said third containers containing a precipitant solution to be brought into contact with the macromolecule sample via a liquid-liquid diffusion process so as to facilitate the crystallization of the macromolecule;

allowing the gel in said second container to be brought into contact with the precipitant solution through a second one of the openings of said second container while maintaining the contact between the macromolecule sample in said first container and the gel in said second container; and after a lapse of a given time from the initiation of the contact between the gel and the precipitant solution, replacing a part or all of the precipitant solution.

* * * * *